United States Patent
Kumon et al.

(10) Patent No.: US 6,649,322 B2
(45) Date of Patent: Nov. 18, 2003

(54) POSITIVE RESIST COMPOSITION AND POSITIVE RESIST BASE MATERIAL USING THE SAME

(75) Inventors: Satoshi Kumon, Kanagawa (JP); Hiroto Yukawa, Livingston (GB)

(73) Assignee: Tokyo Ohka Kogyo Co., Ltd., Kanagawa (JP)

(*) Notice: Subject to any disclaimer, the term of this patent is extended or adjusted under 35 U.S.C. 154(b) by 0 days.

(21) Appl. No.: 09/994,890

(22) Filed: Nov. 28, 2001

(65) Prior Publication Data

US 2002/0076649 A1 Jun. 20, 2002

(30) Foreign Application Priority Data

Nov. 30, 2000 (JP) .......................... 2000-364490

(51) Int. Cl.$^7$ ............................. G03F 7/004
(52) U.S. Cl. ................. 430/270.1; 430/905; 430/914
(58) Field of Search ..................... 430/270.1, 914, 430/905

(56) References Cited

FOREIGN PATENT DOCUMENTS

| JP | 5-113667 A | 5/1993 |
|---|---|---|
| JP | 2000131847 | * 5/2000 |

OTHER PUBLICATIONS

JPO website English translation of JP 2000131874, May–2000.*

Patent Abstracts of Japan, JP 5–113667, date May 7, 1993.

* cited by examiner

*Primary Examiner*—Rosemary Ashton
(74) *Attorney, Agent, or Firm*—Sughrue Mion, PLLC

(57) ABSTRACT

A positive resist composition comprising: (A) a compound which generates an acid upon irradiation with active light or radiant ray, and (B) a resin which exhibits increased solubility in an alkali by action of an acid and includes a copolymer including (b-1) 40% to 85% by mole of a unit having an alkali-soluble group, (b-2) 3% to 25% by mole of a unit having (i) an acid-decomposable dissolution-inhibiting group and (ii) a group which accelerates dry-etching resistance, and (b-3) 3% to 40% by mole of a unit having an acid-decomposable dissolution-inhibiting group and being other than the units (b-1) and (b-2). This composition is a chemically amplified positive resist composition that can be applied to a resist having a reduced thickness, is excellent in dry-etching resistance and definition and can form a patterned resist with a good sectional shape.

13 Claims, No Drawings

POSITIVE RESIST COMPOSITION AND POSITIVE RESIST BASE MATERIAL USING THE SAME

BACKGROUND OF THE INVENTION

1. Field of the Invention

The present invention relates to a positive resist composition and to a positive resist base material using the same.

2. Description of the Related Art

Lithographic processes requiring the definition in the vicinity of 0.25 μm and using a chemically amplified positive resist have been launched in practical applications. Separately, with an increasing demand on semiconductor devices having reduced sizes, next-generation processes requiring fine patterns of from 0.13 μm to 0.22 μm using KrF excimer laser have been developed.

One of such conventional chemically amplified resists comprises a copolymer of p-vinylphenol and tert-butyl methacrylate as a resin ingredient (Japanese Unexamined Patent Application Publication No. 5-113667). The tert-butyl group in the resin is known as a typical acid-decomposable dissolution-inhibiting group but is insufficient in etching resistance. In next-generation processes, definition should further be improved by reducing the thickness of a resist (to 0.5 μm or below) on an anti-reflection coating. However, the use of the tert-butyl group may further deteriorate dry-etching resistance in such a thinned resist film.

When a resist layer using the aforementioned resin is formed on an anti-reflection coating on a substrate, the anti-reflection coating prevents reflected light from the substrate, and an upper part of the resist layer is therefore overexposed as compared with the lower part thereof. In addition, the acid-decomposable dissolution-inhibiting group has weak hydrophobicity, and the resulting resist layer has an insufficient insolubilized surface layer. Accordingly, the top of the resulting patterned resist becomes round.

Additionally, this type of resins only has one acid-decomposable dissolution-inhibiting group in one molecule, and the resulting resist exhibits insufficient contrast between exposed portions and unexposed portions, has deteriorated definition and resist pattern profile and cannot be applied to further miniaturized semiconductor devices.

SUMMARY OF THE INVENTION

Accordingly, an object of the present invention is to provide a chemically amplified positive resist composition that can be applied to a resist having a reduced thickness, is excellent in dry-etching resistance and definition and can yield a patterned resist with a good profile (sectional shape).

The present inventors have found that the above objects can be achieved by using a positive resist composition comprising (A) a compound which generates an acid upon irradiation with active light or radiant ray, and (B) a resin which exhibits increased solubility in an alkali by action of an acid and includes a copolymer comprising (b-1) 40% to 85% by mole of a unit having an alkali-soluble group, (b-2) 3% to 25% by mole of a unit having (i) an acid-decomposable dissolution-inhibiting group and (ii) a group which accelerates dry-etching resistance, and (b-3) 3% to 40% by mole of a unit having an acid-decomposable dissolution-inhibiting group other than the units (b-1) and (b-2). The positive resist composition may further include a tertiary aliphatic lower amine, or an carboxylic acid, an oxoacid of phosphorus or a derivative thereof according to necessity. The present invention provides, in another aspect, a positive resist base material including a substrate, an anti-reflection coating formed on the substrate and having a predetermined thickness, and a resist layer formed on the anti-reflection coating, including the positive resist composition and having a predetermined thickness.

DESCRIPTION OF THE PREFERRED EMBODIMENTS

Ingredient (A)

The ingredient (A) for use in the present invention is an "acid generator", a compound which generates an acid upon irradiation with active light or radiant ray. The ingredient (A) is not specifically limited and can freely be selected from conventional acid generators such as iodonium salts, sulfonium salts, and other onium salts, oxime sulfonate compounds, bisalkyl-, biscycloalkyl- or bisarylsulfonyldiazomethanes, nitrobenzylsulfonates, iminosulfonates, and disulfones.

As the ingredient (A) for use in the present invention, an onium salt having a fluoroalkylsulfonate ion as an anion can advantageously be used. This type of onium salts generates an acid having higher strength and can sufficiently decompose the acid-decomposable dissolution-inhibiting group in the ingredient (B).

Cations constituting the onium salts include, for example, diphenyliodonium or triphenylsulfonium which may optionally have a substituent. Such substituents include methyl, ethyl, propyl, n-butyl, tert-butyl, and other lower alkyl groups; and methoxy, ethoxy, and other lower alkoxy groups.

Anions constituting the onium salts are fluoroalkylsulfonate ions in which part or all of the hydrogen atoms of the alkyl moiety is fluorinated. The more carbon atoms the alkyl moiety has and the less the hydrogen atoms are fluorinated (the less the proportion of fluorine atoms in the alkyl moiety is), the less the strength as a sulfonic acid is. Accordingly, a fluoroalkylsulfonate ion, in which all the hydrogen atoms of an alkyl group having from 1 to 10 carbon atoms are fluorinated, is preferred.

Such onium salts are represented by following Formulae (I) and (II):

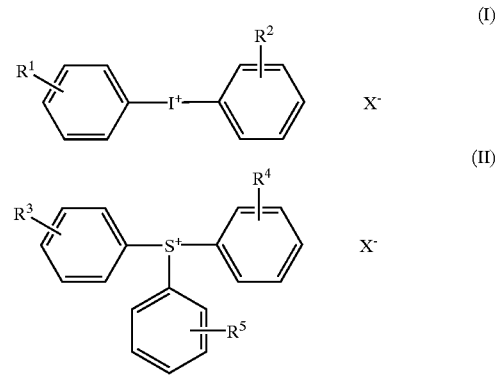

wherein $R^1$, $R^2$, $R^3$, $R^4$ and $R^5$ are each independently a hydrogen atom, an alkyl group having from 1 to 4 carbon atoms, or an alkoxy group having 1 or 2 carbon atoms; and $X^-$ is a fluoroalkylsulfonate ion.

Examples of the onium salts include, but are not limited to, trifluoromethanesulfonate or nonafluorobutanesulfonate of diphenyliodonium, trifluoromethanesulfonate or nonafluorobutanesulfonate of bis(4-tert-butylphenyl)iodonium, trifluoromethanesulfonate or nonafluorobutanesulfonate of triphenylsulfonium, trifluoromethanesulfonate or nonafluorobutanesulfonate of tri(4-methylphenyl)sulfonium, trifluoromethanesulfonate or nonafluorobutanesulfonate of tri(4-methoxyphenyl)sulfonium, trifluoromethanesulfonate or nonafluorobutanesulfonate of dimethylphenylsulfonium, and trifluoromethanesulfonate or nonafluorobutanesulfonate of methylcyclohexyl(2-oxocyclohexyl)sulfonium. Each of these onium salts can be used alone or in combination.

The amount of the ingredient (A) is from 0.5 to 20 parts by weight, and preferably from 5 to 15 parts by weight, relative to 100 parts by weight of the ingredient (B). If the amount of the ingredient (A) is out of this range, the resulting resist may not satisfactorily be patterned and may not yield a uniform resist solution.

Ingredient (B)

The ingredient (B) for use in the present invention is a resin which exhibits increased solubility in an alkali by action of an acid and includes a copolymer comprising (b-1) 40% to 85% by mole of a unit having an alkali-soluble group, (b-2) 3% to 25% by mole of a unit having (i) an acid-decomposable dissolution-inhibiting group and (ii) a group which accelerates dry-etching resistance, and (b-3) 3% to 40% by mole of a unit having an acid-decomposable dissolution-inhibiting group and being other than the units (b-1) and (b-2). The ingredient (B) has a weight average molecular weight (Mw) of preferably from 2000 to 15000 and more preferably from 3000 to 11000, a number average molecular weight (Mn) of preferably from 1000 to 10000 and more preferably from 1500 to 7000 and a molecular weight distribution (Mw/Mn) of preferably from 1.2 to 1.8 and more preferably from 1.3 to 1.7.

The unit (b-1) having an alkali-soluble group may be any unit having, for example, a phenolic hydroxyl group or a carboxyl group. The unit (b-1) may further have another substituent such as a lower alkyl group, as long as the alkali-solubility is not deteriorated. Examples of the unit (b-1) include a hydroxystyrene unit and α-methylhydroxystyrene unit. By comprising 40% to 85% by mole, and preferably from 60% to 80% by mole, of the unit (b-1), the ingredient (B) exhibits appropriate alkali-solubility after exposure and can yield a resist pattern exhibiting satisfactory etching resistance and having a good sectional shape. An example of the unit (b-1) is a unit represented by the following structural formula:

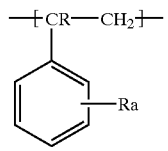

wherein Ra is a hydroxyl group or a carboxyl group; and R is a hydrogen atom or a methyl group. The substituent Ra is preferably substituted on the para-position, as the material is industrially advantageous and is easily available.

The unit (b-2) is a unit having both (i) an acid-decomposable dissolution-inhibiting group and (ii) a group which accelerates dry etching resistance. The ingredient (B) comprises from 3% to 25% by mole, and preferably from 5% to 20% by mole of the unit (b-2). By this configuration, the acid-decomposable dissolution-inhibiting group becomes insoluble in alkali in unexposed portions, and in contrast, is decomposed by action of an acid generated from the ingredient (A) in exposed portions, and the resulting exposed portions become soluble in alkali to pattern a resist. The unit (b-2) has the group (ii) which accelerates dry etching resistance, and the resulting resist film exhibits excellent dry etching resistance even when the thickness thereof is reduced.

Specific examples of the unit (b-2) are units derived from acrylic acid and having an ester group and (ii) a group which accelerates dry etching resistance on a carbon atom at the alpha position of the acrylic acid, which ester group comprises (i) an acid-decomposable dissolution-inhibiting group. More specifically, the unit (b-2) is preferably a unit represented by following Formula (III):

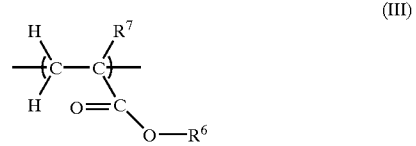

wherein $R^7$ is (ii) a group which accelerates dry etching resistance; and $R^6$ is (i) an acid-decomposable dissolution-inhibiting group. The acid-decomposable dissolution-inhibiting group (i) is not specifically limited and includes any of groups known as acid-decomposable dissolution-inhibiting groups for use in chemically amplified resists.

Examples of the group $R^6$ in Formula (III) include tert-butyl group, tert-amyl group, and other tertiary alkyl groups; 1-methylcyclohexyl group, 1-ethylcyclohexyl group, and other 1-alkyl-substituted monocycloalkyl groups; 2-methyladamantyl group, 2-ethyladamantyl group, and other 2-alkyl-substituted polycycloalkyl groups (2-alkyl-substituted bridged cyclic hydrocarbon groups); tert-butoxycarbonylmethyl (—$CH_2$COO-tert-butyl) group, tert-amyloxycarbonylmethyl (—$CH_2$COO-tert-amyl) group, tert-butoxycarbonylethyl (—$C_2H_4$COO-tert-butyl) group, tert-amyloxycarbonylethyl (—$C_2H_4$COO-tert-amyl) group, and other tertiary-alkyloxycarbonyl-alkyl groups; ethoxyethyl group, methoxypropyl group, and other chain alkoxy-substituted alkyl groups; tetrahydropyranyl group, tetrahydrofuranyl group, and other cyclic ether groups. Among them, tert-butyl group is typically preferred.

The group (ii) $R^7$ which accelerates dry-etching resistance includes, for example, alicyclic hydrocarbon groups. Such alicyclic hydrocarbon groups have been proposed for use in ArF resists, are highly optically transparent to irradiated light or radiant ray and improve dry etching resistance of the resulting resists. The alicyclic hydrocarbon groups have high hydrophobicity in addition to dry etching resistance, therefore contribute to form a surface insoluble layer of the resist layer and can satisfactorily pattern the resist even on an anti-reflection coating.

The alicyclic hydrocarbon groups include, but are not limited to, organic groups each having a monocyclic cycloalkyl group or a polycyclic alicyclic hydrocarbon groups. Such monocyclic cycloalkyl groups include cyclopentyl and cyclohexyl groups. Rings constituting such polycyclic alicyclic hydrocarbon groups include, for example, spiroheptane ring, spirooctane ring, norbornane ring (corresponding to norbornyl group), adamantane ring (corresponding to adamantyl group), bornene ring, menthone ring (corresponding to menthyl group), menthane ring, thujane ring, sabinene ring, thujone ring, carane ring, carene ring, pinane ring, norpinane ring, bornane ring, fenchane ring, tricyclene ring, cholesterin ring, camphor ring, isocamphor ring, isobornane ring (corresponding to isobornyl group), diterpene rings, and triterpene rings. The organic group is a group connecting between the dry-etching resistance accelerating group and the alpha carbon of the acrylic acid and is not always necessary.

Among them, organic groups each having a bicycloalkyl group are preferred, of which isobornyloxymethylene group is typically preferred. A specifically preferred unit (b-2) is a unit derived from tert-butyl (α-isobornyloxymethyl) acrylate.

The unit (b-3) having an acid-decomposable dissolution-inhibiting group is a unit having no alkali-soluble group as in the unit (b-1) and having an acid-decomposable dissolution-inhibiting group other than that of the unit (b-2). The acid-decomposable dissolution-inhibiting group in the unit (b-3) plays a similar role to that of the acid-decomposable dissolution-inhibiting group in the unit (b-2) and includes similar acid-decomposable dissolution-inhibiting groups as in the unit (b-2). Examples of the unit (b-3) are units represented by the following structural formula:

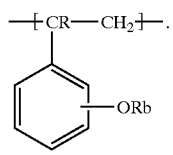

wherein Rb is, for example, a tert-butyl group, tert-butoxycarbonylmethyl group, ethoxyethyl group, tetrahydropyranyl group, tetrahydrofuranyl group, or tert-butoxycarbonyl group; and R is a hydrogen atom or a methyl group.

By comprising 3% to 40% by mole, and preferably 5% to 25% by mole of the unit (b-3) in addition to the unit (b-2), the resulting ingredient (B) has two types of acid-decomposable dissolution-inhibiting groups in one molecule of the copolymer. In the formation of a fine pattern of a size of less than or equal to 140 nm, the resist composition comprising this copolymer exhibits higher contrast and more excellent definition and resist pattern profile than the case using a resin having one type of acid-decomposable dissolution-inhibiting group (protective group) in one molecule.

Among them, tert-butoxystyrene and other tertiary alkoxy-substituted styrene units are preferred as the unit (b-3) from the viewpoint of synthesis of the ingredient (B).

The resin ingredient as the ingredient (B) may be a copolymer further comprising conventional acrylic monomers, styrene or derivatives thereof as comonomer units in addition to the units (b-1), (b-2) and (b-3) within a range not deteriorating the objects of the present invention. The ingredient (B) can be synthetically prepared by, for example, a method described in Japanese Unexamined Patent Application Publication No. 11-171836.

Ingredient (C)

The tertiary aliphatic lower amine for use as the ingredient (C) is used for improving definition. Such tertiary aliphatic lower amines include, but are not limited to, trimethylamine, triethylamine, tri-n-propylamine, triisopropylamine, tri-n-butylamine, triisobutylamine, tri-tert-butylamine, tripentylamine, triethanolamine, and tributanolamine. Among them, triethanolamine and other trialkanolamines are preferred.

Ingredient (D)

To avoid tailing or tapering of the resulting resist on a thin film formed on a substrate, the resist composition may further comprise a carboxylic acid, an oxoacid of phosphorus or a derivative thereof according to necessity. Such thin films include, for example, silicon nitride (SiN, $Si_3N_4$ or SiON) films, TiN film and other nitrogen-containing thin films, phosphosilicate glass film (PSG) and other phosphorus-containing thin films, borosilicate glass film (BSG) and other boron-containing thin films, and borophosphosilicate glass film (BPSG) and other phosphorus-boron-containing thin films.

The carboxylic acid includes, but is not limited to, saturated or unsaturated aliphatic carboxylic acids, alicyclic carboxylic acids, aromatic carboxylic acids, and other carboxylic acids. Such saturated aliphatic carboxylic acids include, for example, formic acid, acetic acid, propionic acid, butyric acid, isobutyric acid, oxalic acid, malonic acid, succinic acid, glutaric acid, adipic acid, and other mono- or poly-carboxylic acids. The unsaturated aliphatic carboxylic acids include, for example, acrylic acid, crotonic acid, isocrotonic acid, 3-butenoic acid, methacrylic acid, 4-pentenoic acid, propiolic acid, 2-butynoic acid, maleic acid, fumaric acid, and acetylenecarboxylic acid. The alicyclic carboxylic acids include, for example, 1,1-cyclohexanedicarboxylic acid, 1,2-cyclohexanedicarboxylic acid, 1,3-cyclohexanedicarboxylic acid, 1,4-cyclohexanedicarboxylic acid, and 1,1-cyclohexanediacetic acid. The aromatic carboxylic acids include, for example, p-hydroxybenzoic acid, o-hydroxybenzoic acid (salicylic acid), 2-hydroxy-3-nitrobenzoic acid, phthalic acid, terephthalic acid, isophthalic acid, and other aromatic carboxylic acids each having a subsistent such as a hydroxyl group, nitro group or carboxyl group.

The oxoacid of phosphorus includes, but is not limited to, phosphoric acids, phosphorous acid and derivatives (e.g., esters) thereof such as phosphoric acid, phosphorous acid, di-n-butyl phosphate, and diphenyl phosphate; phosphonic acid and derivatives (e.g., esters) thereof such as phosphonic acid, dimethyl phosphonate, di-n-butyl phosphonate, phenyl phosphonate, diphenyl phosphonate, and dibenzyl phosphonate; phosphinic acid and derivatives (e.g., esters) thereof such as phosphinic acid and phenyl phosphinate. Among them, phenyl phosphonate is preferred.

The amounts of the ingredients (C) and (D) are each from 0.01% to 5% by weight and preferably from 0.1% to 2.0% by weight relative to the weight of the ingredient (B). If the amounts of these ingredients exceed the above range, the resulting resist may not satisfactorily be patterned. If the amounts are less than the above range, the advantages of the addition of the ingredients (C) and (D) may not be exhibited, thus inviting tailing or tapered profile.

Positive Resist Base Materials

The positive resist composition of the present invention may be directly formed on a substrate. Preferably, an organic or inorganic anti-reflection coating having a thickness of 30 to 200 nm is formed on the substrate, and a resist film having a thickness of 200 to 500 nm is then formed on the anti-reflection coating using the positive resist composition of the present invention. The resulting resist base material can pattern the resist with a good shape and high definition, and the patterned resist is highly resistant to etching. The anti-reflection coating is preferably an organic anti-reflection coating prepared by using, for example, an coating composition for an anti-reflection coating such as "BC-K037" (trade name; available from Tokyo Ohka Kogyo Co., Ltd.). This type of anti-reflection coating can satisfactorily inhibit reflection of irradiated light or radiant ray from the substrate. When the resist layer is formed on this anti-reflection coating, an insolubilized surface layer derived from the unit (b-2) of the ingredient (B) is formed, and the resulting patterned resist has a good shape.

The present invention will be illustrated in further detail with reference to several examples and comparative examples below, which are not intended to limit the scope of the invention.

EXAMPLE 1

Diphenyliodonium trifluoromethanesulfonate was used as the ingredient (A).

A copolymer having a weight average molecular weight (MW) of 3600, number average molecular weight (Mn) of 2500 and a molecular weight distribution (Mw/Mn) of 1.44 was used as the ingredient (B). This copolymer contained 49% by mole of a hydroxystyrene unit, 15% by mole of a unit derived from tert-butyl (α-isobornyloxymethyl) acrylate, and 36% by mole of tert-butoxystyrene unit and had the following constitutional repeating units:

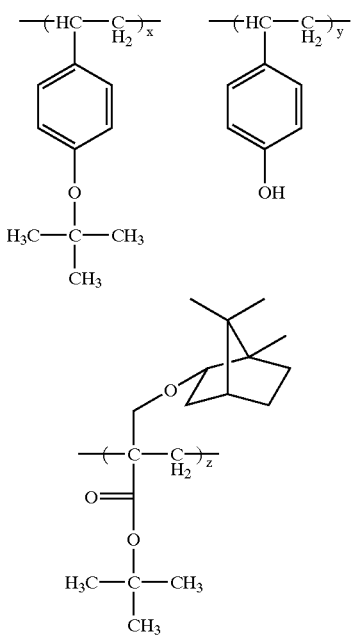

wherein x is 0.36; y is 0.49; and z is 0.15. Triethanolamine and o-hydroxybenzoic acid (salicylic acid) were used as the ingredients (C) and (D), respectively.

In 300 parts by weight of ethyl lactate, 4 parts by weight of the ingredient (A), 100 parts by weight of the ingredient (B), 0.30 part by weight of the ingredient (C) and 0.28 part by weight of the ingredient (D) were dissolved, 1.0% of a fluorinated silicon-based surfactant (produced by DAINIPPON INK AND CHEMICALS, INC., under the trade name of "MEGAFACE R08") was added to the resulting solution, the resulting mixture was filtrated through a 0.2-μm membrane filter and thereby yielded a positive resist coating composition.

Onto a silicon wafer carrying an anti-reflection coating 100 nm thick formed from an anti-reflection coating composition "BC-K037" (tradename; available from Tokyo Ohka Kogyo Co., Ltd.), the above-prepared positive resist coating composition was applied by spin coating, was dried on a hot plate at 120° C. for 90 seconds and thereby yielded a resist layer 410 nm thick.

The resist layer was then selectively irradiated with KrF excimer laser using a reducing-type projection aligner (produced by Nikon Corporation, under the trade name of "NSR-S 203B"; NA=0.6), was subjected to post-exposure baking (PEB) at 110° C. for 90 seconds, was subjected to puddle developing in a 2.38% by weight tetramethylammonium hydroxide aqueous solution at 23° C. for 30 seconds, was further subjected to post-exposure baking at 100° C. for 60 seconds and thereby yielded a patterned positive resist.

The above-patterned positive resist had a 130 nm-isolation line pattern with a good shape. The exposure (sensitivity) to reproduce this line pattern was 16 mJ/cm$^2$.

The patterned resist was then subjected to dry etching with a gaseous mixture of $CF_4$, $CHF_3$ and He using a dry etching system (available from Tokyo Ohka Kogyo Co., Ltd., under the trade name of "OAPM-2400"). As a result, the film residual rate per unit time (angstrom/min.) as dry etching resistance of the patterned resist was 1239 angstrom/min.

EXAMPLE 2

A positive resist was prepared in the same manner as in Example 1, except that 100 parts by weight of a copolymer was used as the ingredient (B), which copolymer had a weight average molecular weight of 6100, a number average molecular weight of 4400 and a molecular weight distribution (Mw/Mn) of 1.4 and included 75% by mole of a hydroxystyrene unit, 15% by mole of a unit derived from tert-butyl (α-isobornyloxymethyl) acrylate, and 10% by mole of a tert-butoxystyrene unit. The resulting positive resist was then patterned in the same manner as in Example 1.

The patterned positive resist had a 130 nm-isolation line pattern with a good shape. The exposure (sensitivity) to reproduce this line pattern was 15 mJ/cm$^2$. The dry etching resistance of the patterned resist was determined in the same manner as in Example 1 and was found to be 1230 angstrom/min.

EXAMPLE 3

A positive resist was prepared in the same manner as in Example 1, except that 100 parts by weight of a copolymer was used as the ingredient (B), which copolymer had a weight average molecular weight of 10300, a number average molecular weight of 6400 and a molecular weight distribution (Mw/Mn) of 1.60 and included 75% by mole of a hydroxystyrene unit, 15% by mole of a unit derived from tert-butyl (α-isobornyloxymethyl) acrylate, and 10% by mole of a tert-butoxystyrene unit. The resulting positive resist was then patterned in the same manner as in Example 1.

The patterned positive resist had a 130 nm-isolation line pattern with a good shape. The exposure (sensitivity) to reproduce this line pattern was 14.5 mJ/cm$^2$. The dry etching resistance of the patterned resist was determined in the same manner as in Example 1 and was found to be 1217 angstrom/min.

COMPARATIVE EXAMPLE 1

A positive resist was prepared in the same manner as in Example 1, except that 100 parts by weight of a copolymer was used as the ingredient (B), which copolymer had a weight average molecular weight of 8000, a number average molecular weight of 6000 and a molecular weight distribution (Mw/Mn) of 1.33 and included 60% by mole of a hydroxystyrene unit, 15% by mole of a unit derived from tert-butyl methacrylate, and 25% by mole of a styrene unit. The resulting positive resist was then patterned in the same manner as in Example 1.

The patterned positive resist had a 130 nm-isolation line pattern with a bad shape. The exposure (sensitivity) to reproduce this line pattern was 20 mJ/cm². The dry etching resistance of the patterned resist was determined in the same manner as in Example 1 and was found to be 1390 angstrom/min. This patterned resist was reduced in thickness more than all the patterned resists according to the examples and had deteriorated etching resistance.

COMPARATIVE EXAMPLE 2

A positive resist was prepared in the same manner as in Example 1, except that 100 parts by weight of a copolymer was used as the ingredient (B), which copolymer had a weight average molecular weight of 15000, a number average molecular weight of 6800 and a molecular weight distribution (Mw/Mn) of 2.2 and included 60% by mole of a hydroxystyrene unit, 15% by mole of a unit derived from 1-ethylcyclohexyl methacrylate, and 25% by mole of a styrene unit. The resulting positive resist was then patterned in the same manner as in Example 1.

The patterned positive resist had a 130 nm-isolation line pattern with a bad shape. The exposure (sensitivity) to reproduce this line pattern was 23 mJ/cm². The dry etching resistance of the patterned resist was determined in the same manner as in Example 1 and was found to be 1283 angstrom/min. This patterned resist was reduced in thickness more than all the patterned resists according to the examples and had deteriorated etching resistance.

Other embodiments and variations will be obvious to those skilled in the art, and this invention is not to be limited to the specific matters and areas stated above.

What is claimed is:

1. A positive resist composition comprising:
   (A) a compound which generates an acid upon irradiation with active light or radiant ray; and
   (B) a resin which exhibits increased solubility in an alkali by action of an acid, the resin including a copolymer comprising:
      (b-1) 40% to 85% by mole of a hydroxystyrene unit or α-methylhydroxystyrene unit;
      (b-2) 3% to 25% by mole of a unit having (i) an acid-decomposable dissolution-inhibiting group and (ii) a group which accelerates dry-etching resistance; and
      (b-3) 3% to 40% by mole of a unit having an acid-decomposable dissolution-inhibiting group and being other than the units (b-1) and (b-2).

2. The positive resist composition according to claim 1, wherein the unit (b-3) is a styrene unit or α-methylstyrene unit having an acid-decomposable dissolution-inhibiting group.

3. The positive resist composition according to claim 2, wherein the unit (b-3) is a tert-butoxystyrene unit.

4. The positive resist composition according to claim 1, wherein the unit (b-2) is a unit being derived from acrylic acid and having an ester group and the group (ii) which accelerates dry etching resistance on a carbon atom at the alpha position of the acrylic acid, the ester group comprising (i) the acid-decomposable dissolution-inhibiting group.

5. The positive resist composition according to claim 4, wherein the acid-decomposable dissolution-inhibiting group (i) is one selected from the group consisting of tertiary alkyl groups, 1-alkyl-substituted monocycloalkyl groups, 2-alkyl-substituted polycycloalkyl groups, tertiary-alkoxycarbonyl-alkyl groups, chain alkoxyalkyl groups, cyclic ether groups and combinations thereof.

6. The positive resist composition according to claim 5, wherein the acid-decomposable dissolution-inhibiting group (i) is one selected from the group consisting of tert-butyl group, 1-methylcyclohexyl group, 1-ethylcyclohexyl group, 2-methyladamantyl group, 2-ethyladamantyl group, tert-butoxycarbonylmethyl group, ethoxyethyl group, tetrahydropyranyl group, tetrahydrofuranyl group, and combinations thereof.

7. The positive resist composition according to claim 4, wherein the group (ii) which accelerates dry etching resistance is a polycyclic alicyclic hydrocarbon group.

8. The positive resist composition according to claim 7, wherein the polycyclic alicyclic hydrocarbon group is an isobornyl group.

9. The positive resist composition according to claim 4, wherein the unit (b-2) is a unit derived from tert-butyl (α-isobornyloxymethyl) acrylate.

10. The positive resist composition according to claim 1, further comprising (C) a tertiary aliphatic lower amine in an amount from 0.01 to 1.0 part by weight relative to 100 parts by weight of the ingredient (B).

11. The positive resist composition according to claim 1, further comprising (D) a carboxylic acid, an oxoacid of phosphorus, or a derivative thereof in an amount of from 0.01 to 1.0 part by weight relative to 100 parts by weight of the ingredient (B).

12. The positive resist composition according to claim 1, wherein the ingredient (A) is an onium salt comprising a fluoroalkylsulfonate ion as an anion.

13. A positive resist base material comprising:
   a substrate;
   an anti-reflection coating being formed on the substrate and having a thickness of 30 to 200 nm; and
   a resist layer being formed on the anti-reflection coating, comprising the positive resist composition as claimed in claim 1 and having a thickness of 200 to 400 nm.

* * * * *